United States Patent [19]
Hirakata

[11] Patent Number: 5,243,456
[45] Date of Patent: Sep. 7, 1993

[54] SEMICONDUCTOR DEVICE

[75] Inventor: Noriyuki Hirakata, Kanagawa, Japan

[73] Assignee: Sumitomo Electric Industries, Ltd., Osaka, Japan

[21] Appl. No.: 725,679

[22] Filed: Jul. 3, 1991

[30] Foreign Application Priority Data

Jul. 10, 1990 [JP] Japan ................................ 2-182458

[51] Int. Cl.$^5$ ............................................. H04B 10/04
[52] U.S. Cl. ................................. 359/180; 359/181; 307/480; 307/527
[58] Field of Search ............... 359/180, 181, 184, 186, 359/140, 139, 188, 158, 162; 307/480, 590, 603, 605, 269, 527, 518, 265

[56] References Cited

U.S. PATENT DOCUMENTS

| | | | |
|---|---|---|---|
| 4,694,196 | 9/1987 | Hasley et al. | 307/527 |
| 4,754,164 | 6/1988 | Flora et al. | 307/269 |
| 4,757,214 | 7/1988 | Kobayashi | 307/601 |
| 4,760,291 | 7/1988 | Nakajima et al. | 307/601 |
| 4,914,326 | 4/1990 | Kikuda et al. | 307/605 |
| 4,929,850 | 5/1990 | Breuninger | 307/480 |
| 4,945,262 | 7/1990 | Piasecki | 307/594 |
| 4,955,081 | 9/1990 | Takahashi | 359/181 |
| 4,970,405 | 11/1990 | Hagiwara | 307/480 |
| 5,057,722 | 10/1991 | Kobatake | 307/605 |

OTHER PUBLICATIONS

High speed data formal converter circuit, IBM Technical Disclosure Bulletin, vol. 29, No. 11, May 11, 1987 New York, pp. 5036-5039.
G. Turinsky, Schroner Impulsdetektor, Radio Fernsehen Elektronik, vol. 37, No. 2, 1988, Berlin DD, p. 131.

Primary Examiner—Edward L. Coles, Sr.
Assistant Examiner—R. Bacares
Attorney, Agent, or Firm—Cushman, Darby & Cushman

[57] ABSTRACT

A semiconductor device for driving a light emitting element used in high speed optical communication. The semiconductor device comprises circuitry for delaying a clock signal and producing first and second delay signals. The second delay signal has a delay time different from that of the first delay signal. The first delay signal controls flip-flop circuitry which receives a data signal and outputs a signal indicative of the data signal. The first delay signal also controls a first latch circuit to receive the signal from the flip-flop circuitry and output a signal with the delay time of the first delay signal. The second delay signal controls a second latch circuit to receive the signal from the flip-flop circuitry and output a signal with the delay time of the second delay signal. The signals output from the first and second latch circuits are logically combined by logic circuitry. The logic circuitry is either AND or OR circuitry. The logic circuitry outputs the result of the combination to driving circuitry which provides the current to drive the light emitting element in accordance with the output of the logic circuitry.

8 Claims, 4 Drawing Sheets

SEMICONDUCTOR DEVICE

BACKGROUND OF THE INVENTION

1. Field of the Invention

The present invention relates to a semiconductor device for driving a light emitting element used in high speed optical communication.

2. Description of the Related Art

As demand for information transmission increases, the need for high speed/large capacity optical communication information transmitting systems increases. In the optical communication art, light emitting diodes (LEDs) and semiconductor lasers (LDs) have been used for converting electric signals to optical signals in transmitter devices.

As the amount of transmitted information increases, the on/off periods of the LEDs become smaller. When these on/off periods are reduced, the pulse widths of the light output signals differ from the pulse widths of the original electric signals due to various characteristics of the related electric circuits and the LEDs. Accordingly, it is difficult for the receiver to receive data signals which accurately represent the electronic data signals.

To overcome this problem, a circuit as shown in FIG. 2 was developed. Data signals for driving a light emitting element 25, which arrive at input terminal 20, are applied to two delay circuits 21 and 22. Delay circuits 21 and 22 each delay the respective signals for a different amount of time. These signals having different delay times are output from the delay circuits 21 and 22 and are logically combined by a logic circuit 23. Signals indicative of the result produced by logic circuit 23 are supplied to a drive circuit 24 which drives a light emitting element 25.

An SCFL (source coupled FET logic) invertor circuit is frequently used for each of the delay circuits 21 and 22. An example of this type of delay circuit 34 is shown in FIG. 3. In this circuit, the delay time is controlled by adjusting a gate voltage (control voltage $V_{cnt}$), which is applied to constant current source 32 in source follower circuit 31 through input terminal 33. The control voltage $V_{cnt}$ can be fixed for the delay circuit 21.

This circuit arrangement has several problems. For example, when input data signals are delayed using an electrical delay circuit, the rising/falling time of the pulse of these signals increases with an increase of the delay time. Therefore, fluctuation of the input data signal pattern increases.

SUMMARY OF THE INVENTION

An object of the present invention is to overcome problems relating to fluctuation of the input data signal pattern.

To achieve this object, the present invention provides a semiconductor device comprising: a flip-flop circuit to which a data signal is input, first and second latch circuits which receive an output signal of the flip-flop circuit, a logic circuit for logically combining output signals of the first and second latch circuits, and a drive circuit for supplying a drive signal to a light emitting element in accordance with an output signal provided by the logic circuit. The semiconductor device further comprises circuitry for delaying a clock signal and providing the delayed clock signal as a first delay clock signal to the flip-flop circuit and the first latch circuit, and as a second delay clock signal to the second latch circuit.

With the above circuit arrangement, a clock signal having a repetitive waveform is applied to the delay circuitry. Therefore, the delay circuitry is able to provide first and second delay clock signals with no fluctuation to the flip-flop circuit and two latch circuits.

The semiconductor device operates as follows. A data signal is input into the flip-flop circuit in accordance with the first delay clock signal. The data signal is then input from the flip-flop circuit to the two latch circuits in accordance with the first and second delay clock signals. These data signals, now having different delay times due to the first and second delay clock signals, are output from the two latch circuits to the logic circuit. The logic circuit logically combines the data signals provided by the two latch circuits and outputs a signal indicative of the result of this combination to the drive circuit. The drive circuit then applies current to drive the light emitting element in accordance with the output of the logic circuit.

As described above, a clock signal is delayed by two delay circuits, each providing different delay times, and the data pulse width is adjusted in accordance with the different delay times of the clock signals. However, in the conventional circuit, the data signal itself is delayed by the delay circuits thus increasing data signal fluctuation. Hence, the present invention reduces the possibility of data signal fluctuation and thus provides light output which accurately represent the electronic data signals.

DETAILED DESCRIPTION OF THE PREFERRED EMBODIMENT

Figure 1:
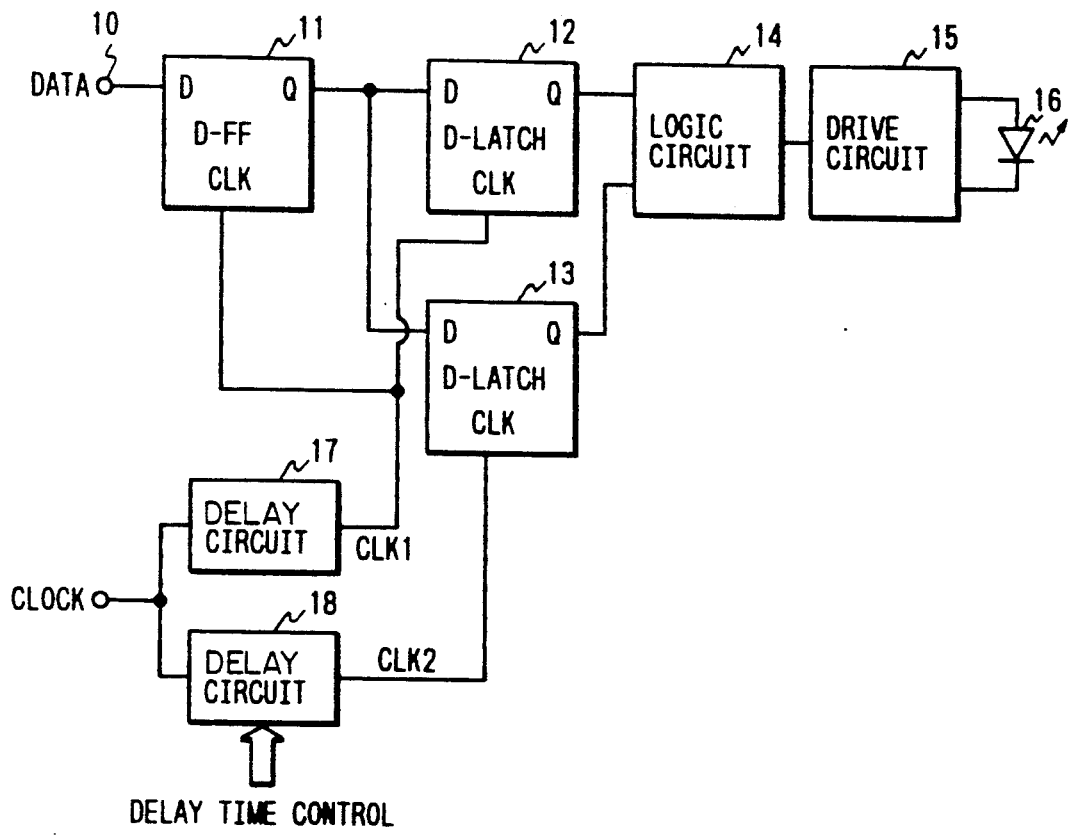
FIG. 1 is a block diagram of a drive circuit for driving a light emitting element according to an embodiment of the present invention.
Figure 2:
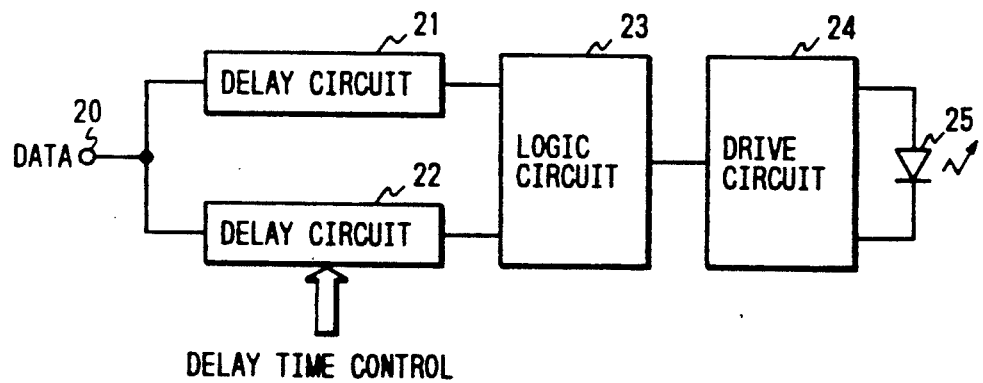
FIG. 2 is a block diagram of a conventional drive circuit for driving a light emitting element.

FIG. 1 is a block diagram of a drive circuit according to an embodiment of the present invention for driving a light emitting element. CLK represents clock input terminals, D represents data signal input terminals, and Q represents data signal output terminals.

A data input terminal 10 receives data and couples it to a "D" input of a D-type flip-flop circuit 11. A "Q" output of flip-flop circuit 11 is coupled to a "D" input of a D-type latch circuit 12 and to a "D" input of a latch circuit 13. A "Q" output of latch circuit 12 is coupled to a first input of a logic circuit 14. A "Q" output of latch circuit 13 is coupled to a second input of logic circuit 14. An output terminal of the logic circuit 14 is coupled to the input terminal of a drive circuit 15. Drive circuit 15 provides current to drive a light emitting element 16 which emits light in accordance with the output of logic circuit 14.

A clock signal (CLOCK) is applied to inputs of delay circuits 17 and 18 which provide signals CLK1 and CLK2 respectively. CLK1 is coupled to CLK inputs of flip-flop circuit 11 and latch circuit 12. CLK2 is coupled to a CLK input of latch circuit 13. The delay of circuit 18 can be adjusted externally.

Figure 3A:
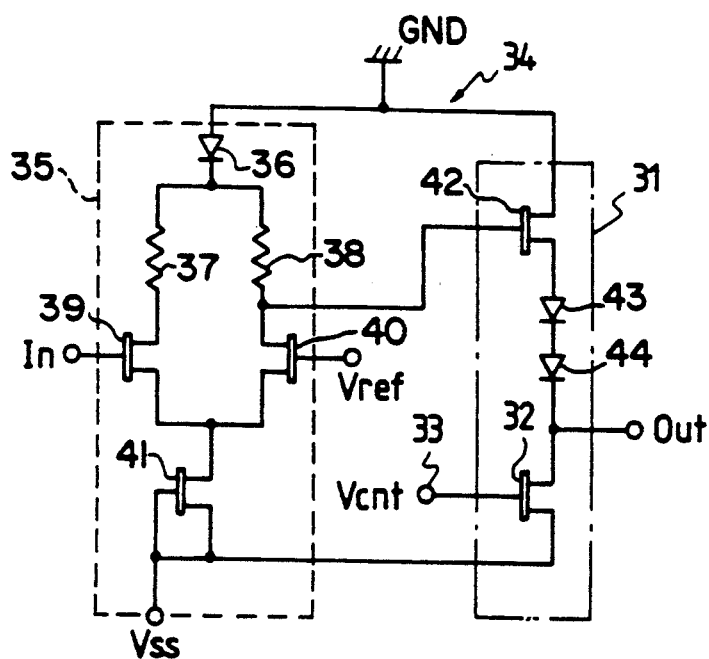
FIG. 3A is a circuit diagram showing a delay circuit.

Delay circuit 18 can be implemented by a delay circuit 34, as shown in FIG. 3A or the like. The delay circuit 34 shown in FIG. 3A, which is exemplary of an electrically adjustable delay circuit, is divided into a switch portion 35 and a source follower circuit portion 31. The switch portion 35 includes a diode 36 having an anode connected to a high-potential (GND) and a cathode connected to a pair of load resistors 37 and 38. The switch portion 35 further comprises a pair of FETs 39 and 40 (e.g. N-channel FETs) having drains connected to the load resistors 37 and 38, respectively, sources connected to each other, and gates having an input signal In and a reference signal Vref applied thereto, respectively. In addition, the switch portion 35 comprises an FED 41 (e.g. N-channel FET) having a drain coupled to the sources of FETs 39 and 40 and a gate and source coupled to a low potential Vss.

The source follower circuit portion 31 includes a source follower FET 42 (e.g. N-channel FET) having a drain coupled to the high-potential GND and a gate coupled to the drain of FET 40. A plurality of diodes 43 and 44 are coupled in series and the anode of diode 33 is coupled to the source of FET 42. The source follower circuit portion 31 further comprises an FET 32 (e.g. N-channel FET ( having an adjusting signal Vcnt applied to the gate thereof, a drain coupled to the source of FET 42 via diodes 43 and 44 and a source coupled to the lower potential Vss.

The current flowing through the switch portion is divided through the pair of load resistors 37 and 38 in accordance with the input signal In and the reference signal Vref. If the input signal In is the larger than the reference signal Rref, a larger amount of current flows into the gate of FET 39 and consequently through load resistor 37. Thus, the voltage drop across load resistor 37 is greater than the voltage drop across load resistor 38. Hence, the voltage applied to the gate of FET 42 is at a high value thus causing the output OUT of the entire delay circuit 34 to be at a high value. In addition, a floating parasitic capacitance, which affects the delay caused by delay circuit 34, is generated in the source follower portion 31 of the delay circuit 34 in accordance with the current flowing through the source follower portion 31. Delay circuit 34 can also be incorporated as delay circuit 17 by fixing the control voltage $V_{cnt}$ applied to terminal 33.

Figure 3B:
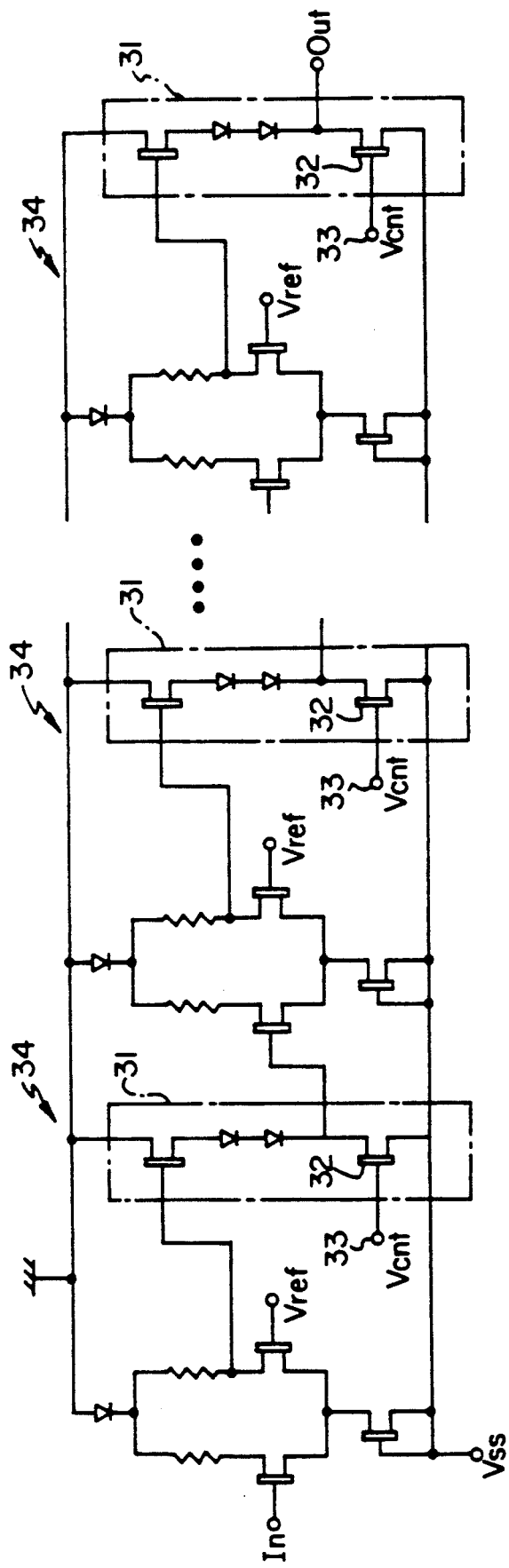
FIG. 3B is a circuit diagram showing a plurality of source follower circuits of the delay circuit of FIG. 3A coupled as a multi-stage structure.
Figure 3C:
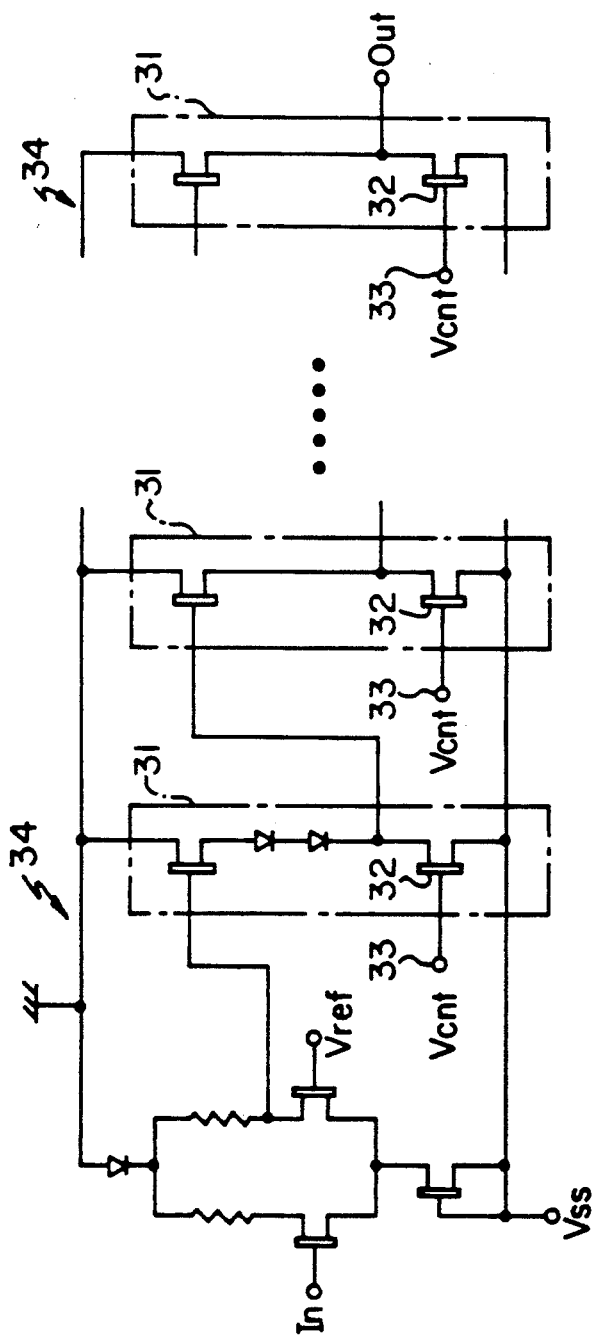

In addition, a plurality of delay circuits 34 can be arranged as a multi-stage structure. This multi-stage structure comprises either a plurality of the entire delay circuit 34 as shown in FIG. 3B or only the source follower circuits 31 as shown in FIG. 3C. In the multi-stage structure, to achieve a stable delay time, the control voltage $V_{cnt}$ can be either equal or different for each stage.

The operation of the circuit in FIG. 1 will now be described. Clock signal CLK1 is applied to the D-type flip-flop circuit 11. In accordance with the clock signal CLK1, the flip-flop circuit 11 inputs a data signal DATA. In response to the clock signal CLK1, the data signal DATA is received by the D-type latch circuit 12. Also, in accordance with a clock signal CLK2 having a delay time different from the clock signal CLK1, the data signal DATA is also received by the D-type latch circuit 13. In response to the clock signals CLK1 and CLK2, the data signal DATA is output from the latch circuits 12 and 13, respectively, to the logic circuit 14. The data signal DATA output by the latch circuit 12 has a delay time different from that of the data signal DATA output by the latch circuit 13 due to the different delay times provided by the clock signals CLK1 and CLK2.

The logic circuit 14 logically combines the data signals DATA output from the latch circuits 12 and 13 and provides data signal indicative of this combination to the drive circuit 15. The drive circuit 15 then supplies current to drive the light emitting element 16 in accordance with the output of logic circuit 14.

Figure 4:
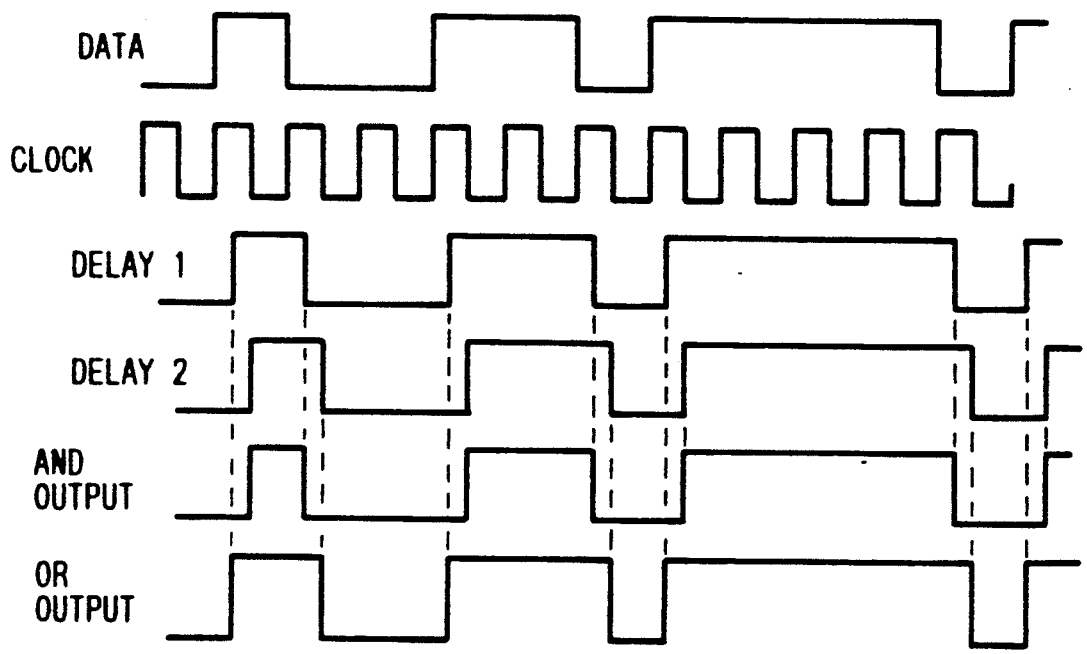
FIG. 4 is a timing chart illustrating operation of the drive circuit of FIG. 1.

The logic circuit 14 can be either an OR or AND circuit. FIG. 4 illustrates waveforms representing the operation of the LED drive circuit of FIG. 1 when logic circuit 14 is either an OR or AND circuit. DELAY1 represents the data signal output by latch circuit 12 in response to the clock signal CLK1. DELAY2 represents the data signal output by the latch circuit 13 in response to the clock signal CLK2. As shown, the data signals output by the latch circuits 12 and 13 are delayed by $\frac{1}{4}$ and $\frac{1}{2}$ clock pulse, respectively. Hence, the data signals are out of phase with each other by $\frac{1}{4}$ clock pulse. Therefore, if the logic circuit 14 is an AND circuit, the logical combination of the data signals output by the latch circuits 12 and 13 produces a signal (AND output) having pulses $\frac{1}{4}$ clock pulse shorter than the pulses of the original data signal. Conversely, an OR logic circuit 14 produces a signal (OR output) having pulses $\frac{1}{4}$ clock longer than the pulses of the original data signal. For example, when the input data signal is an NRZ signal of 1.25 Gbps, the drive time duration of the LED 16 may be reduced or elongated by 200 ps thus eliminating unwanted signal fluctuations due to the characteristics of the circuitry and LED.

The circuit of this embodiment also can be used in combination with a dependent circuit for operating another light emitting element at a high speed.

As evident from the above description, the present invention produces a light output signal having substantially no fluctuation even when an input data signal includes pulse signals with various widths.

While this invention has been described in connection with what is presently considered to be the most practical and preferred embodiment, it is to be understood that the invention is not limited to the disclosed embodiment, but, on the contrary, is intended to cover various modifications and equivalent arrangements included within the spirit and scope of the appended claims.

What is claimed is:

1. A semiconductor device comprising:
means for delaying a clock signal and providing a first delay signal and a second delay signal independent of said first delay signal in accordance with said clock signal, said first and second delay signals having predetermined delay times different from each other;

flip-flop circuit means, coupled to said delaying means, for receiving a data signal and outputting a first signal indicative thereof, said receiving and outputting being controlled by said first delay signal;

first latch circuit means, coupled to said flip-flop circuit means and said delaying means, for receiving said first signal and outputting a second signal indicative of said first signal, said second signal having a delay time in accordance with said early time of said first delay signal;

second latch circuit means, coupled to said flip-flop circuit means and said delaying means, for receiving said first signal and outputting a third signal indicative of said first signal, said third signal having a delay time in accordance with said delay time of said second delay signal;

logic means, coupled to said first and second latch circuit means, for logically combining said second and third signals and providing a fourth logically combined signal in accordance therewith, said fourth logically combined signal always having at least one low level and one high level;

means for emitting a light signal; and means, coupled to said logic means and said light signal emitting means, for driving said light signal emitting means in accordance with said fourth signal.

2. A semiconductor device according to claim 1, wherein said logic means comprises an OR circuit.

3. A semiconductor device according to claim 1, wherein said logic means comprises an AND circuit.

4. A semiconductor device according to claim 1, wherein said delaying means comprises first and second delay circuits for providing said first and second delay signals, respectively.

5. A semiconductor device according to claim 4, wherein each of said delay circuits comprises one source coupled FET logic circuit.

6. A semiconductor device according to claim 4, wherein each of said delay circuits comprises a plurality of source coupled FET logic circuits.

7. A semiconductor device according to claim 5, wherein said source coupled FET logic circuit comprises a source follower circuit.

8. A semiconductor device according to claim 5, wherein said source coupled FET logic circuit comprises a plurality of source follower circuits.

* * * * *